(12) United States Patent  
Reynolds et al.

(10) Patent No.: US 9,400,583 B2  
(45) Date of Patent: Jul. 26, 2016

(54) SENSOR ELECTRODE ROUTING FOR AN INTEGRATED DEVICE

(71) Applicant: SYNAPTICS INCORPORATED, San Jose, CA (US)

(72) Inventors: Joseph Kurth Reynolds, Aliso, CA (US); Petr Shepelev, Campbell, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 14/743,672

(22) Filed: Jun. 18, 2015

(65) Prior Publication Data

US 2015/0286320 A1    Oct. 8, 2015

Related U.S. Application Data

(63) Continuation of application No. 14/635,843, filed on Mar. 2, 2015, which is a continuation of application No. 13/547,638, filed on Jul. 12, 2012, now Pat. No. 8,970,545.

(60) Provisional application No. 61/507,369, filed on Jul. 13, 2011.

(51) Int. Cl.
| | |
|---|---|
| G06F 3/041 | (2006.01) |
| G06F 3/044 | (2006.01) |
| G06F 3/047 | (2006.01) |
| H05K 1/03 | (2006.01) |
| H05K 1/11 | (2006.01) |

(52) U.S. Cl.
CPC .............. *G06F 3/044* (2013.01); *G06F 3/047* (2013.01); *G06F 3/0412* (2013.01); *H05K 1/0306* (2013.01); *H05K 1/115* (2013.01); *G06F 2203/04107* (2013.01); *G09G 2300/0426* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 4,853,497 A | 8/1989 | Landmeier | |
| 6,297,811 B1 | 10/2001 | Kent et al. | |
| 8,310,460 B2 * | 11/2012 | Saitou | G06F 3/044 178/18.01 |
| 2008/0062140 A1 * | 3/2008 | Hotelling et al. | 345/173 |
| 2010/0176963 A1 * | 7/2010 | Vymenets | 340/825.36 |
| 2010/0182273 A1 | 7/2010 | Noguchi et al. | |
| 2011/0181549 A1 | 7/2011 | Hotelling et al. | |
| 2011/0187677 A1 | 8/2011 | Hotelling et al. | |

* cited by examiner

*Primary Examiner* — Joseph Haley  
(74) *Attorney, Agent, or Firm* — Patterson + Sheridan, LLP

(57) ABSTRACT

Embodiments of the present invention generally provide shield electrodes for shielding one or more conductive routing traces from one or more receiver electrodes in an input device comprising a display device integrated with a sensing device to reduce the capacitive coupling between the conductive routing traces and the receiver electrodes. The shield electrode may be configured to reduce the effect of an input object on the capacitive coupling between the conductive routing traces and the receiver electrodes. In other embodiments, end portions of common electrodes shield the receiver electrodes from the conductive routing traces, thereby reducing the capacitive coupling between the receiver electrodes and the conductive routing traces.

20 Claims, 11 Drawing Sheets

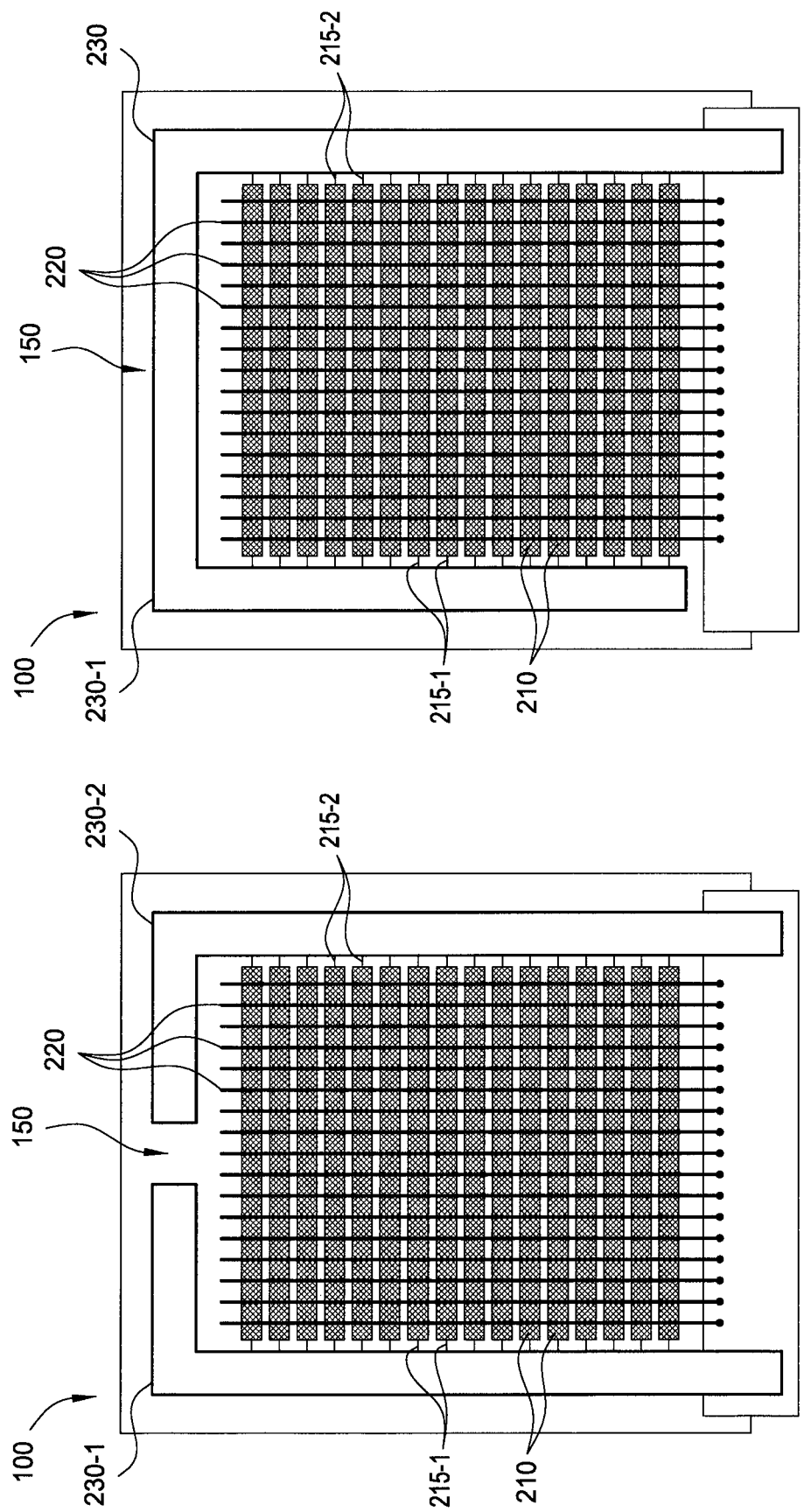

SENSOR ELECTRODE ROUTING FOR AN INTEGRATED DEVICE

CROSS-REFERENCE TO RELATED APPLICATIONS

This application is a continuation of U.S. patent application Ser. No. 14/635,843, filed Mar. 2, 2015, entitled "TRACE SHIELDING FOR INPUT DEVICES" which is a continuation of U.S. patent application Ser. No. 13/547,638, filed Jul. 12, 2012, entitled "TRACE SHIELDING FOR INPUT DEVICES" which claims benefit of U.S. Provisional Patent Application Ser. No. 61/507,369, filed Jul. 13, 2011, entitled "TRACE SHIELDING FOR INPUT DEVICES" which are herein incorporated by reference in their entireties.

BACKGROUND OF THE INVENTION

1. Field of the Invention

Embodiments of the present invention generally relate to a system and device for improving the interference performance of an input device integrated with a display device.

2. Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location, and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

In some configurations, the proximity sensor devices are integrated with supporting components, such as display devices, to provide a desired combined function or to provide a desirable complete device package. In such configurations, the integrated device may include a plurality of common transmitter electrodes configured for display updating and for transmitting input sensing signals, and a plurality of receiver electrodes for receiving the results of the input sensing signals.

As the computing displays in which these capacitive sensing devices are integrated (e.g., touch screen displays) increase in size and resolution, the number of transmitter and receiver electrodes is also increased. As a result, a greater number of routing traces is required to connect the electrodes to the modules by which they are operated. In addition, as device thickness decreases, the distance between the routing traces, through which signals are transmitted to the common transmitter electrodes, and the sensing components, such as the receiver electrodes, is decreased, resulting in undesired interference between the routing traces and the sensing components, especially when an input object approaches the sensing region of the input device.

Therefore, there is a need for an improved system and device for reducing interference in a display device with an integrated input device.

SUMMARY OF THE INVENTION

Embodiments of the present invention generally provide shield electrodes for shielding one or more conductive routing traces from one or more receiver electrodes in an input device integrated with a display device to reduce the capacitive coupling between the conductive routing traces and the receiver electrodes. The shield electrode may be configured to reduce the effect of an input object on the capacitive coupling between the conductive routing traces and the receiver electrodes. In other embodiments, end portions of common electrodes shield the receiver electrodes from the conductive routing traces, thereby reducing the capacitive coupling between the receiver electrodes and the conductive routing traces.

Embodiments of the present invention may also provide a touch screen device with an integrated capacitive sensing device. The touch screen device includes a display device and a plurality of common electrodes disposed in the display device. The plurality of common electrodes is configured for updating the display device and for transmitting transmitter signals for capacitive sensing. The touch screen device further includes a plurality of receiver electrodes and a plurality of conductive routing traces coupled to the plurality of common electrodes. The conductive routing traces are shielded from the plurality of receiver electrodes in a manner that reduces a capacitive coupling between the conductive routing traces and the receiver electrodes and/or at least partially reduces the effect of input objects on the coupling between the conductive routing traces and the receiver electrodes.

Embodiments of the present invention may also provide a touch screen device with an integrated capacitive sensing device. The touch screen device includes a display device and a plurality of common electrodes disposed in the display device. The plurality of common electrodes is configured for updating the display device and for transmitting transmitter signals for capacitive sensing. The touch screen device further includes a plurality of receiver electrodes and a plurality of conductive routing traces coupled to the plurality of common electrodes. The conductive routing traces are shielded from the plurality of receiver electrodes in a manner that reduces a capacitive coupling between the conductive routing traces and the receiver electrodes. The touch screen device further includes a shield electrode positioned to shield the plurality of conductive routing traces from the plurality of receiver electrodes. The shield electrode is configured to reduce the effect of an input object on the capacitive coupling between the conductive routing traces and the receiver electrodes.

Embodiments of the present invention may also provide a touch screen device with an integrated capacitive sensing device. The touch screen device includes a display device and a plurality of common electrodes disposed in the display device. The plurality of common electrodes is configured for updating the display device and for transmitting transmitter signals for capacitive sensing. The touch screen device further includes a plurality of receiver electrodes and a plurality of conductive routing traces coupled to the plurality of common electrodes. The conductive routing traces are shielded from the plurality of receiver electrodes in a manner that reduces a capacitive coupling between the conductive routing traces and the receiver electrodes. The receiver electrodes are shielded from the plurality of conductive routing traces by end portions of the plurality of common electrodes. The common electrodes are configured to reduce the effect of an input object on the capacitive coupling between the conductive routing traces and the receiver electrodes. The end portions of the plurality of common electrodes may be disposed between the plurality of receiver electrodes and the plurality of conductive routing traces. Each end portion of the common electrodes may be coupled to a respective one of the plurality of conductive routing traces through a via.

Embodiments of the present invention may also provide a system for capacitive sensing in a display device. The system includes a plurality of common electrodes configured for display updating and for capacitive sensing and a plurality of conductive routing traces coupled to the plurality of common electrodes. The system further includes a driver module coupled to the plurality of conductive routing traces and configured to drive transmitter signals onto the plurality of common electrodes. The system further includes a plurality of receiver electrodes shielded from the plurality of conductive routing traces in a manner that reduces influence of a presence of an input object on capacitive coupling between the plurality of receiver electrodes and conductive routing traces. The system further includes a receiver module coupled to the plurality of receiver electrodes and configured to receive resulting signals with the receiver electrodes. The system may further comprise a shield electrode positioned to shield the plurality of conductive routing traces from the plurality of receiver electrodes. In one embodiment, the receiver module is disposed on the sealing glass or coupled to the sealing glass though a flexible connector (e.g., a flexible printed circuit board) and a conductive film. In various embodiments, the flexible connector may also comprise a shield electrode. In one such embodiment, the flexible connector may comprise a shield electrode distinct from the shield electrode positioned to shield the plurality of conductive routing traces from the plurality of receiver electrodes.

Embodiments of the present invention may also provide a system for capacitive sensing in a display device. The system includes a plurality of common electrodes configured for display updating and for capacitive sensing and a plurality of conductive routing traces coupled to the plurality of common electrodes. The system further includes a driver module coupled to the plurality of conductive routing traces and configured to drive transmitter signals onto the plurality of common electrodes. The system further includes a plurality of receiver electrodes shielded from the plurality of conductive routing traces in a manner that reduces influence of a presence of an input object on capacitive coupling between the plurality of receiver electrodes and conductive routing traces. The system further includes a receiver module coupled to the plurality of receiver electrodes and configured to receive resulting signals with the receiver electrodes. The receiver electrodes are shielded from the plurality of conductive routing traces by end portions of the plurality of common electrodes. The end portions of the common electrodes may be positioned between the plurality of receiver electrodes and the plurality of conductive routing traces. Each end portion of the plurality of common electrodes may be coupled to a respective one of the plurality of conductive routing traces through a via.

BRIEF DESCRIPTION OF THE DRAWINGS

So that the manner in which the above recited features can be understood in detail, a more particular description, briefly summarized above, may be had by reference to embodiments, some of which are illustrated in the appended drawings. It is to be noted, however, that the appended drawings illustrate only embodiments of the invention and are therefore not to be considered limiting of its scope, for the invention may admit to other equally effective embodiments.

FIG. 3 is a partial schematic plan view of the input device having a two-shield configuration.

FIG. 4 is a partial schematic plan view of the input device having a single-shield configuration.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention generally provide shield electrodes for shielding one or more conductive routing traces from one or more receiver electrodes in an input device comprising a display device integrated with a sensing device to reduce the capacitive coupling between the conductive routing traces and the receiver electrodes. The shield electrode may be configured to reduce the effect of an input object on the capacitive coupling between the conductive routing traces and the receiver electrodes. In other embodiments, end portions of common electrodes shield the receiver electrodes from the conductive routing traces, thereby reducing the capacitive coupling between the receiver electrodes and the conductive routing traces.

Figure 1:
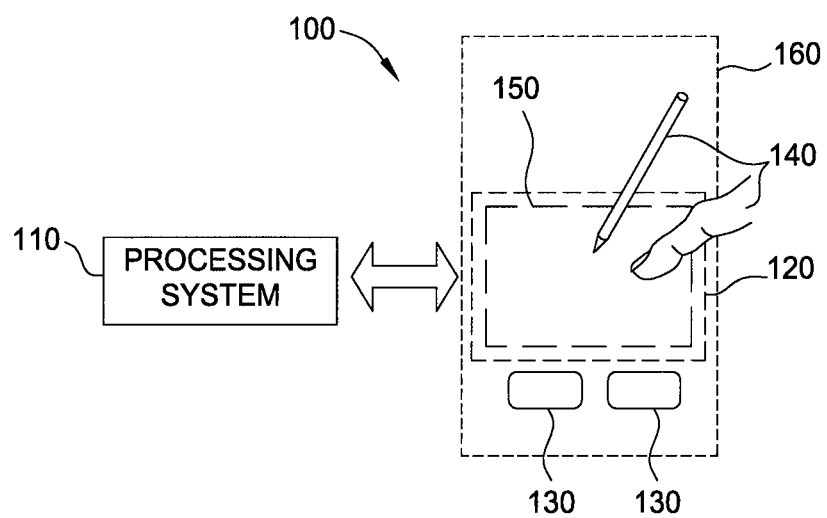
FIG. 1 is a display device having an integrated input device.

Turning now to the figures, FIG. 1 is a block diagram of an exemplary input device 100 in accordance with embodiments of the invention. The input device 100 comprises a display device 160 integrated with a sensing device, such as a capacitive sensing device. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice) and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections (including serial and or parallel connections). Examples include I²C, SPI, PS/2, Universal Serial Bus (USB), Bluetooth, RF, and IRDA.

In the embodiment depicted in FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 overlays the display screen of the display device 160 and encompasses any space above, around, in, and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100. The facesheet (e.g., LCD Lens 510) may provide a useful contact surface for an input object.

The input device 100 may utilize any combination of sensor components and sensing technologies to detect user input in the sensing region 120. The input device 100 comprises one or more sensing elements for detecting user input. Some implementations are configured to provide images that span one, two, three, or higher dimensional spaces. Some implementations are configured to provide projections of input along particular axes or planes. Cursors, menus, lists, and items may be displayed as part of a graphical user interface and may be scaled, positioned, selected scrolled, or moved based at least partially based on positional information due to an input object in sensing region 120.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements 150, such as sensor electrodes, to create electric fields. In some capacitive implementations, separate sensing elements 150 may be ohmically shorted together to form larger sensor electrodes. Some capacitive implementations utilize resistive sheets (e.g., may comprise a resistive material such as ITO or the like), which may be uniformly resistive. In various embodiments, some capacitive implementations utilize resistive sheets which may be comprised of a material comprising open meshes (about less than ten percent filled, but depending on application, the percentage may be higher or lower) of highly conductive materials (e.g., metals).

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In one implementation, an absolute capacitance sensing method operates by modulating sensor electrodes with respect to a reference voltage (e.g., system ground) and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals and/or to one or more sources of environmental interference (e.g., other electromagnetic signals). Sensor electrodes may be dedicated transmitters or receivers, or sensor electrodes may be configured to both transmit and receive. Alternatively, the receiver electrodes may be modulated relative to ground.

In FIG. 1, a processing system 110 is shown as part of the input device 100. The processing system 110 is configured to operate the hardware of the input device 100 to detect input in the sensing region 120. The sensing region 120 includes an array of sensing elements 150. The processing system 110 comprises parts of, or all of, one or more integrated circuits (ICs) and/or other circuitry components. For example, a processing system for a mutual capacitance sensor device may comprise transmitter circuitry configured to transmit signals with transmitter sensor electrodes and/or receiver circuitry configured to receive signals with receiver sensor electrodes. In some embodiments, the processing system 110 also comprises electronically-readable instructions, such as firmware code, software code, and/or the like. In some embodiments, components of the processing system 110 are located together, such as near sensing element(s) of the input device 100. In other embodiments, components of processing system 110 are physically separate with one or more components close to sensing element(s) of input device 100 and one or more components elsewhere. For example, the input device 100 may be a peripheral coupled to a desktop computer, and the processing system 110 may include software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering, scaling, or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120 or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 of the sensing device overlaps at least part of an active area of a display screen of the display device 160. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
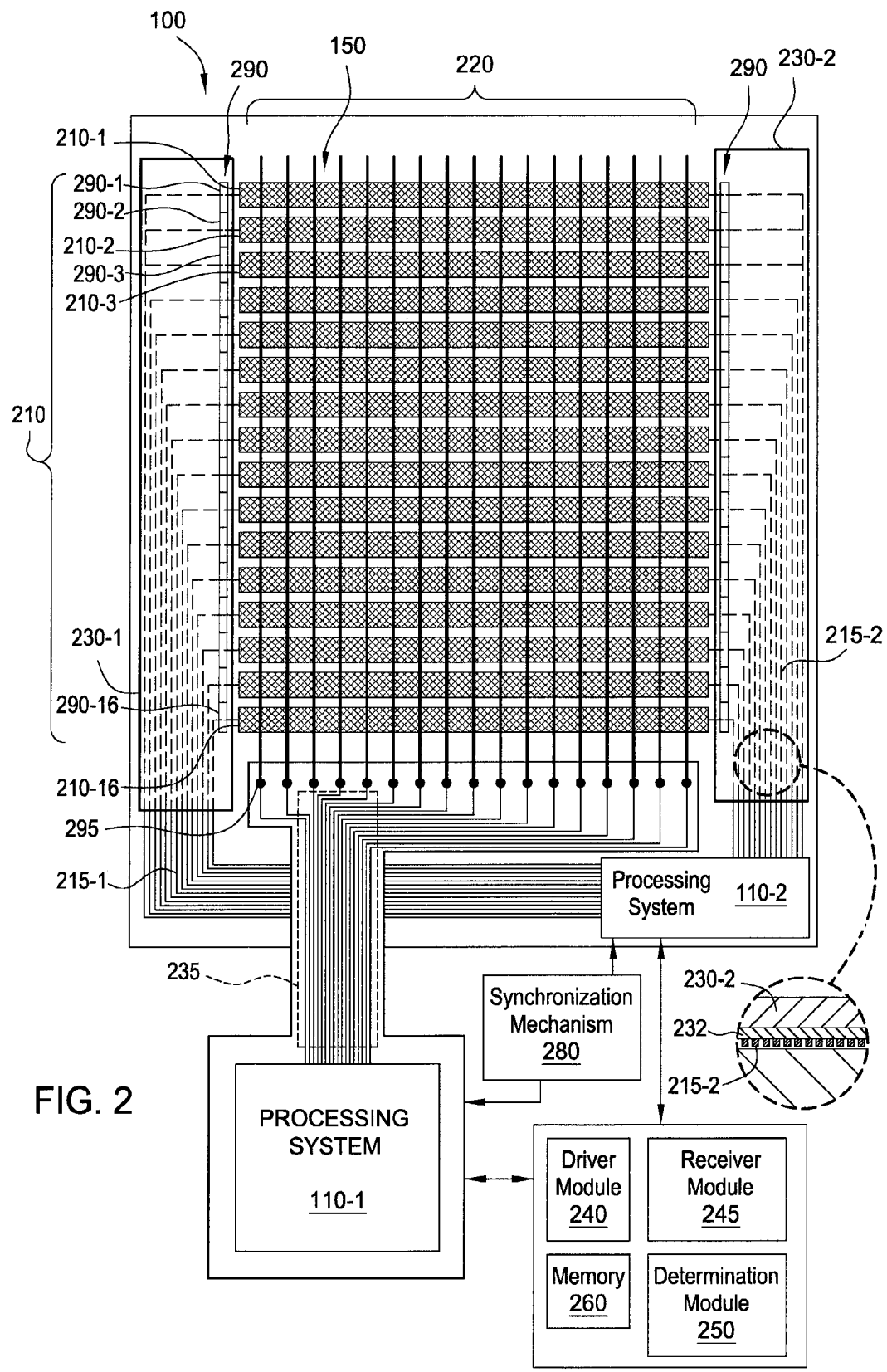
FIG. 2 is a partial schematic plan view of the input device of FIG. 1 in accordance with embodiments of the invention.

FIG. 2 is a partial schematic plan view of the input device 100 of FIG. 1 in accordance with embodiments of the invention. The input device 100 includes an array of sensing elements 150, a processing system 110, and a synchronization mechanism 280. The array of sensing elements 150 includes a plurality of common electrodes 210 (e.g., 210-1, 210-2, 210-3, etc.) and a plurality of receiver electrodes 220 (e.g., 220-1, 220-2, 220-3, etc.). The processing system 110 may include two separate processing system integrated circuits (ICs) (e.g., processing system IC 110-1 and processing system IC 110-2). Processing system IC 110-1, 110-2 may include a driver module 240, a receiver module 245, a determination module 250, and/or a memory 260 and a synchronization mechanism 380.

The processing system IC 110-1 is coupled to the plurality of receiver electrodes 220 and configured to receive resulting signals from the receiver electrodes 220. Processing system IC 110-1 may also be configured to pass the resulting signals to the determination module 250 for determining the presence of an input object and/or to the memory 260 for storage. In various embodiments, the processing system IC 110-2 may be coupled to optional drivers 290 for the common electrodes. The optional drivers 290 may be fabricated using the thin-film-transistors (TFT) and may comprise switches, combinatorial logic, level shifters, multiplexers, and other selection and control logic to drive selected common electrodes.

The processing system IC 110-2 is coupled to the common electrodes 210 through a plurality of conductive routing traces 215-1, 215-2 (collectively "215"). Processing system IC 110-2 includes display circuitry (not shown) and a driver module 240, one or both of which may be configured for updating images on the display screen of the display device 160. For example, the display circuitry may be configured to apply one or more pixel voltages to the display pixel electrodes through pixel source drivers (not shown). The display circuitry may also be configured to apply one or more common drive voltages to the common electrodes 210 (selected ones of the common electrodes 210) with the driver module 240 to update the display screen. In addition, the processing system IC 110-2 is configured to operate the common electrodes 210 as transmitter electrodes for input sensing by driving transmitter signals onto the common electrodes 210 (selected ones of the common electrodes 210) with the driver module 240.

As shown in FIG. 2, conductive routing traces 215-1 are coupled to one end of each common electrode 210, and conductive routing traces 215-2 are coupled to the other end of each common electrode 210 such that each common electrode 210 is driven for input sensing and/or display updating from both ends. It is also contemplated that conductive routing traces 215 may be coupled to only a single end of each of the common electrodes 210 or have another configuration.

While the processing system illustrated in FIG. 2 includes two integrated circuits (ICs), the processing system may be implemented with more or less ICs to control the various components in the input device. For example, the functions of the processing system IC 110-1 and the processing system IC 110-2 may be implemented in one integrated circuit that can control the display module elements (e.g., common electrodes 210) and drive transmitter signals and/or receive resulting signals received from the array of sensing elements 150. In embodiments where there are more than one processing system IC, communications between separate processing system ICs 110-1, 110-2 may be achieved through the synchronization mechanism 280, which sequences the signals provided to the common electrodes 210. Alternatively the synchronization mechanism may be internal to a single one of any one of the IC's.

Common electrodes 210 and receiver electrodes 220 are ohmically isolated from each other by one or more insulators which separate the common electrodes 210 from the receiver electrodes 220 and prevent them from electrically shorting to each other. The electrically insulative material separates the common electrodes 210 and the receiver electrodes 220 at cross-over areas at which the electrodes intersect. In one such configuration, the common electrodes 210 and/or receiver electrodes 220 are formed with jumpers connecting different portions of the same electrode. In other configurations, the common electrodes 210 and the receiver electrodes 220 are separated by one or more layers (e.g., coupled through vias) of electrically insulative material or by one or more continuous substrates, as described in further detail below.

The areas of localized capacitive coupling between common electrodes 210 and receiver electrodes 220 may be termed "capacitive pixels." The capacitive coupling between the common electrodes 210 and receiver electrodes 220 changes with the proximity and motion of input objects in the sensing region 120 associated with the common electrodes 210 and the receiver electrodes 220.

In various embodiments of the invention, the conductive routing traces 215 are shielded from the receiver electrodes 220. In the embodiment depicted in FIG. 2, the conductive routing traces 215 are shielded from the receiver electrodes 220 by shield electrodes 230-1, 230-2 (collectively "230") in a manner that reduces the capacitive coupling between the conductive routing traces 215 and the receiver electrodes 220. The shield electrodes 230 may be vertically aligned over the conductive routing traces 215 and are positioned between the conductive routing traces 215 and the receiver electrodes 220. The shield electrodes 230 may also be positioned between the conductive routing traces 215 and an input object to reduce capacitive coupling between the conductive routing traces 215 and the input object, which may affect the capacitive signals received by the receiver electrodes 220. To prevent the shield electrodes 230 from interfering with the transmission of signals to the common electrodes 210, the shield electrodes 230 are electrically isolated from the conductive routing traces 215, for example, by an insulating layer 232.

The shield electrodes 230 may suppress the degree to which other sources of interference (e.g., signal transmitters, wireless radios, external interference coupled through an input object, etc.) affect the quality of the signal received by the receiver electrodes 220. For example, when positioned between the conductive routing traces 215 and the receiver electrodes 220 and/or between the conductive routing traces 215 and an input object (e.g., a finger, a stylus, etc.), the shield electrodes 230 reduce the effect of the input object on the capacitive coupling between the conductive routing traces 215 and the receiver electrodes 220. As a result, because various capacitance sensing methods are based on detecting changes in capacitive coupling (e.g., mutual capacitance methods), "noise" produced due to the capacitive coupling of the conductive routing traces 215 with the input object and/or receiver electrodes 220 is reduced, increasing the accuracy with which the presence or absence of the input object can be detected. Reducing noise from the conductive routing traces 215 is particularly important near the edges of the sensing region 120, where there are fewer capacitive "pixels" and, consequently, less input sensing information. Thus, the shield electrodes 230 increase response uniformity between the center and edges of the sensing region 120, increasing the accuracy with which the sensing region 120 is able to detect the presence or absence of an input object. In one embodiment, the shield electrodes 230 increase response uniformity between the center and edges of the sensing region 120, increasing the accuracy with which the sensing region 120 is able to detect the presence or absence of an input object especially near an edge of the input device 100.

The shield electrodes 230 are made of a conducting material, such as a metal or a transparent conductive oxide (e.g., indium tin oxide), and may be formed as solid strip, a mesh, or any other configuration which is capable of blocking electromagnetic fields. In addition, although the shield electrodes 230 are shown as rectangular in shape, they may be formed in any shape which effectively shields the receiver electrodes 220 from the conductive routing traces 215. In some embodiments, the shield electrodes 230 may be disposed around the edges of the device and/or may also serve as an electrostatic discharge (ESD) strike ring.

The shield electrodes 230 may be driven with a shield signal, such as a system ground of the device. In other embodiments, the shield electrodes 230 are driven with a constant voltage signal or with any other signal able to sufficiently shield the conductive routing traces 215. The shield electrode(s) 230 may be coupled with one or more processing system ICs 110, and one or more processing system ICs 110 may be configured to drive the shield electrode(s) 230. For example, one or more shield electrodes 230 may be coupled to one or more processing system ICs 110 through a common flexible connector, flexible printed circuit (FPC), such as a "flex tail," or other connecting device. Optionally, the flex tail may include a shield electrode and may be coupled to the receiver electrodes 220 by a plurality of through-connections, contacts or vias 295 disposed on a sealing glass layer of the input device 100. In another embodiment, a flex tail, distinct from the flex tail coupled to the receiver electrodes 220 may be coupled to the display device.

Although various embodiments presented herein describe the shield electrodes 230 as being positioned between the receiver electrodes 220 and the conductive routing traces 215 to reduce capacitive coupling between these elements, the shield electrodes 230 may also be positioned such that they do not directly obstruct the line-of-sight between these elements. That is, configurations in which the shield electrodes 230 are positioned off-axis from the line-of-sight between the receiver electrodes 220 and the conductive routing traces 215 may provide sufficient shielding to reduce the capacitive coupling between the receiver electrodes 220 and the conductive routing traces 215. Consequently, the shield electrodes 230 may be disposed on the same layer as the receiver electrodes 220, or the shield electrodes 230 may be disposed on a layer that is between the lens (510 in FIG. 5) and the layer on which the receiver electrodes 220 are disposed. In one embodiment, an optional flexible printed circuit may be coupled to the input device, where the optional flexible printed circuit comprises a shield electrode that is separate from shield electrode 230. In yet another embodiment, shield electrode 230 may be integrated within a display device.

FIG. 3 is a partial schematic plan view of the input device 100 having a two-shield configuration. FIG. 4 is a partial schematic plan view of the input device 100 having a single-shield configuration. In the two-shield configuration, conductive routing traces 215-1 are shielded by shield electrode 230-1, and conductive routing traces 215-2 are shielded by shield electrode 230-2. In this configuration, the shield electrodes 230-1, 230-2 may be coupled together with one or more conductive routing traces 215, for example, in order to provide a shield signal to the shield electrodes 230. In the single-shield configuration, both sets of conductive routing traces 215-1, 215-2 are shielded by shield electrode 230. Other shield configurations, such as configurations including three or more shield electrodes, may also be used with the input and display devices 100, 160 described herein.

In order to prevent the shield electrode(s) 230 from acting as an antenna—and potentially interfering with wireless communication signals sent to and from the device in which input device 100 is disposed—the shield electrode(s) 230 may be configured such that they do not form a closed loop. Thus, in the two-shield configuration shown in FIG. 3, shield electrode 230-1 is electrically isolated from shield electrode 230-2. In the single-shield configuration shown in FIG. 4, the shield electrode 230 may be connected to the flex cable at a single end and, thus, does not form a closed loop. In one embodiment, the shield electrode 230 may be connected to a separate shield on the flex cable at a single end.

Figure 5:
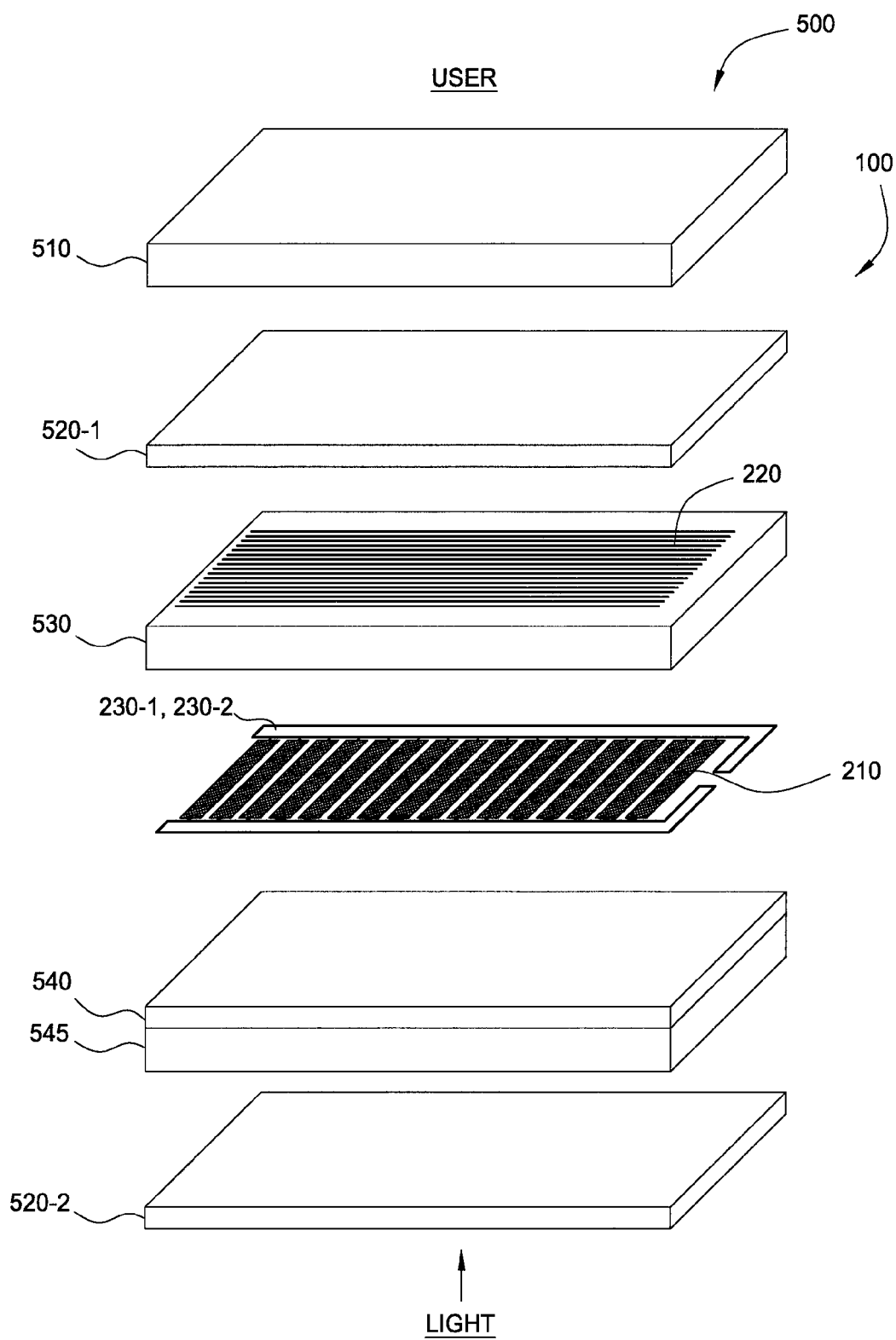
FIG. 5 is an exploded schematic view of a liquid crystal display (LCD) device integrated with input device.

FIG. 5 is an exploded schematic view of a liquid crystal display (LCD) device 500 integrated with input device 100. The LCD device 500 includes input device 100, a lens 510, polarizing layers 520-1, 520-2, a sealing layer 530 (e.g., a color filter glass layer), a liquid crystal layer 540, and a thin-film transistor (TFT) substrate layer 545. The common electrodes 210 and conductive routing traces 215 of the input device 100 are disposed on a bottom surface (i.e., a surface facing away from the user) of the sealing layer 530 (e.g., a vertical alignment LCD). The receiver electrodes 220 of the input device 100 are disposed on a top surface (i.e., a surface facing towards the user) of the sealing layer 530. The shield electrodes 230 are disposed on the bottom surface of the sealing layer 530 between the conductive routing traces 215 and the lens 510.

Although FIG. 5 shows the receiver electrodes 220 as being disposed on the top surface of the sealing layer 530, it is contemplated that the receiver electrodes 220 may be disposed on any layer of the device (e.g., top or bottom surfaces of polarizing layer 520-1, bottom surface of the lens, etc.), so long as the receiver electrodes 220 are electrically isolated from the common electrodes 210 and are positioned between the lens 510 and the common electrodes 210. In one embodiment, the sensor electrodes (the common electrodes and the receiving electrodes) may be disposed on the same layer.

The LCD device 500 may be a vertically aligned LCD device (e.g., a patterned vertical alignment LCD, multi-domain vertical alignment LCD, etc.). Consequently, in the configuration shown in FIG. 5, the common electrodes 210, which are configured to be driven for input sensing and display updating, are disposed proximate the top surface of the liquid crystal layer 540. However, in other display types (e.g., in-plane switching (IPS), plane-to-line switching (PLS), twisted nematic (TN), etc.), the common electrodes 210 may be disposed on any layer which enables the electrodes to be driven for both input sensing and display updating.

Figure 6:
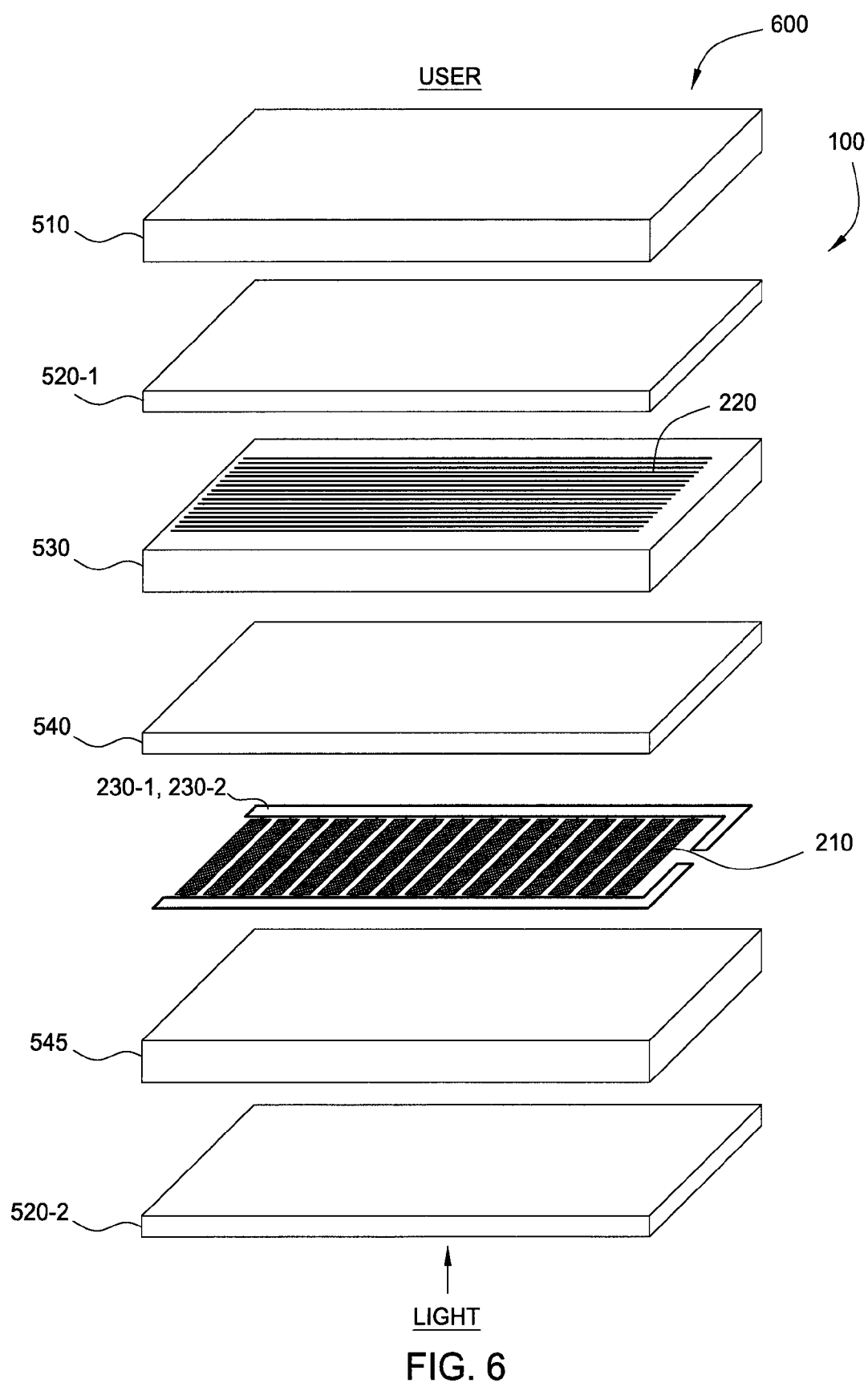
FIG. 6 is an exploded schematic view of a LCD device integrated with input device.

FIG. 6 is an exploded schematic view of a LCD device 600 integrated with input device 100. The LCD device 600 may be an IPS- or PLS-type LCD device. Thus, the common electrodes 210 are disposed on the top surface of the TFT substrate layer 545. The shield electrodes 230 are disposed on the top surface of the TFT substrate layer 545, between the conductive routing traces 215 and the lens 510, and/or proximate the bottom surface of the liquid crystal layer 540.

Figure 7:
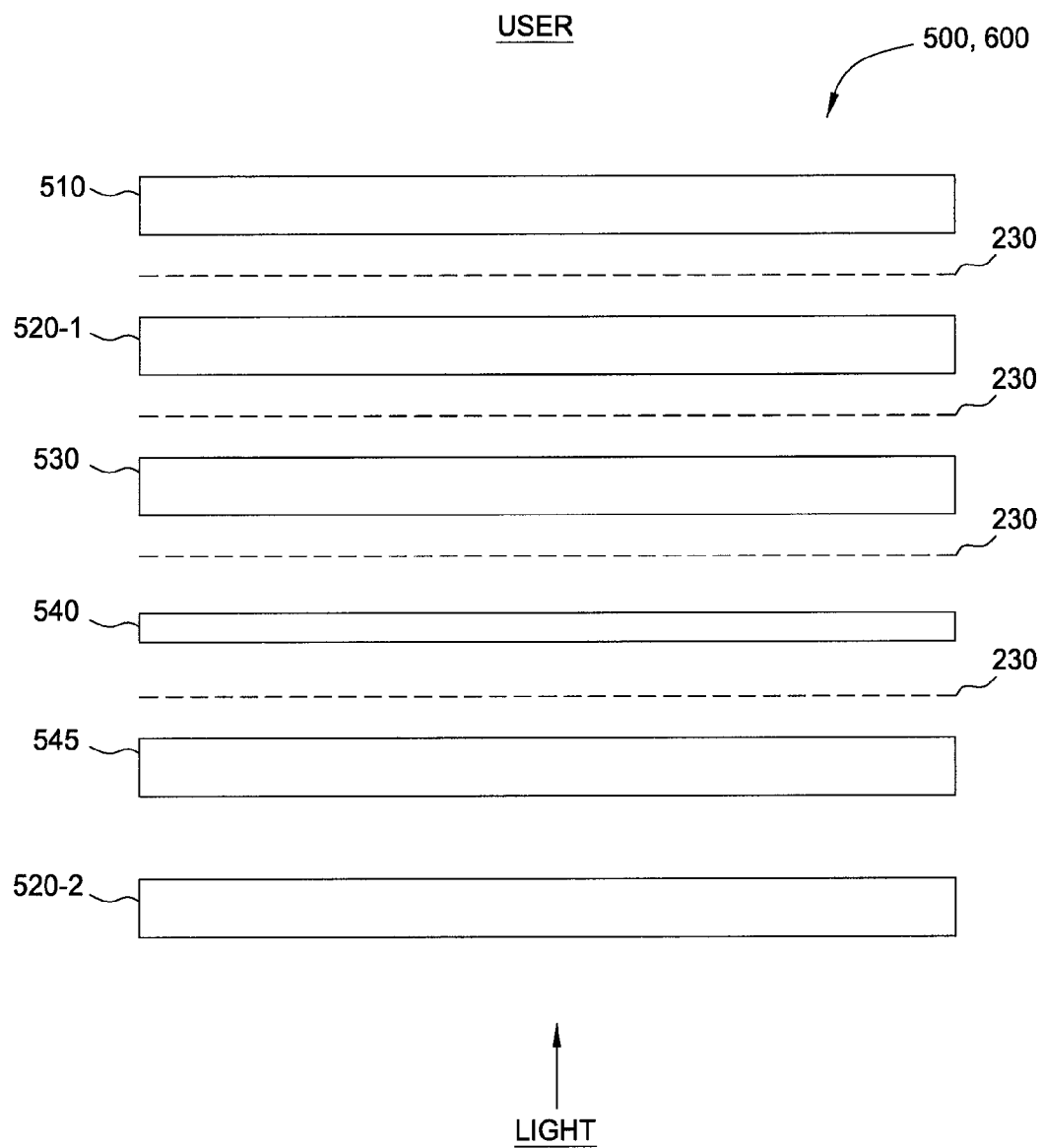
FIG. 7 is an exploded schematic view of a LCD device illustrating locations at which one or more shield electrode(s) may be disposed.

FIG. 7 is an exploded schematic view of a LCD device (e.g., LCD device 500 or LCD device 600) illustrating alternative locations at which the shield electrode(s) 230 may be disposed. The shield electrode(s) 230 may include an insulating layer, such as the insulating layer 232 shown in FIG. 2, proximate the top and/or bottom of the shield electrode(s) 230 if required to isolate the shield electrode(s) 230 from another conductor. In each configuration illustrated in FIG. 7, the shield electrode(s) 230 may be disposed on or in one or both of the layers or substrates between which they are displayed. For example, the shield electrode(s) 230 may be disposed next to the bottom surface of the lens 510 and/or on the top surface of the polarizing layer 520-1. Alternatively, the shield electrode(s) 230 may be disposed proximate the bottom of the liquid crystal layer 540 and/or on the top surface of the TFT substrate layer 545. Optionally, the shield electrode(s) 230 may be disposed within any of the layers and/or substrates illustrated in FIG. 7 between the lens 510 and liquid crystal layer 540 in order to shield the receiver electrodes 220 from the conductive routing traces 215.

Figure 8:
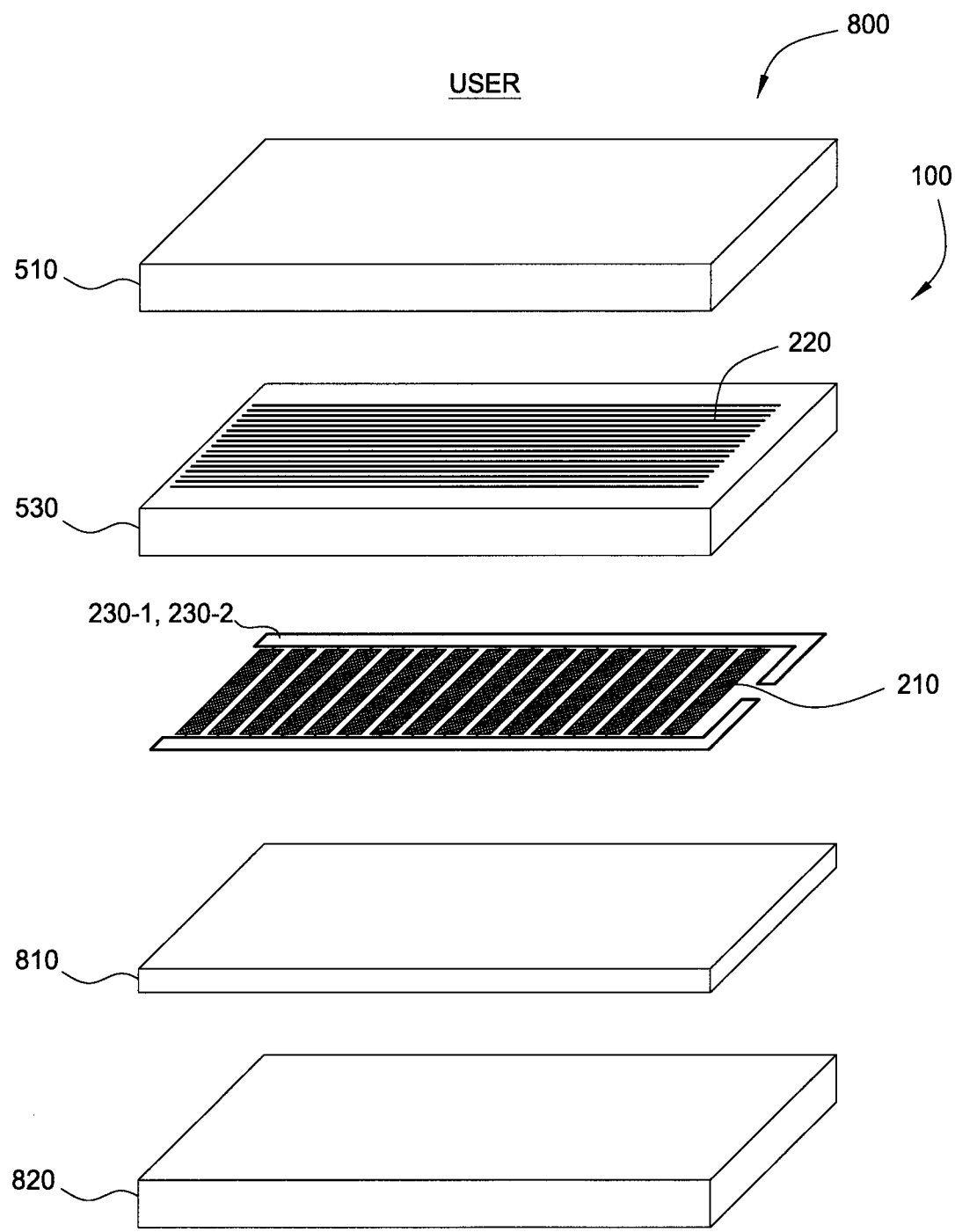
FIG. 8 is an exploded schematic view of an organic light-emitting diode (OLED) display device with input device.

FIG. 8 is an exploded schematic view of an organic light-emitting diode (OLED) display device 800 integrated with input device 100. The OLED display device 800 includes input device 100, a lens 510, a sealing layer 530, an OLED layer 810, and a substrate layer 820. The common electrodes 210 and conductive routing traces 215 of the input device 100 are disposed on the bottom surface of the sealing layer 530. The receiver electrodes 220 of the input device 100 are disposed on the top surface of the sealing layer 530. The shield electrodes 230 are disposed on the bottom surface of the sealing layer 530 between the conductive routing traces 215 and the lens 510.

Figure 9:
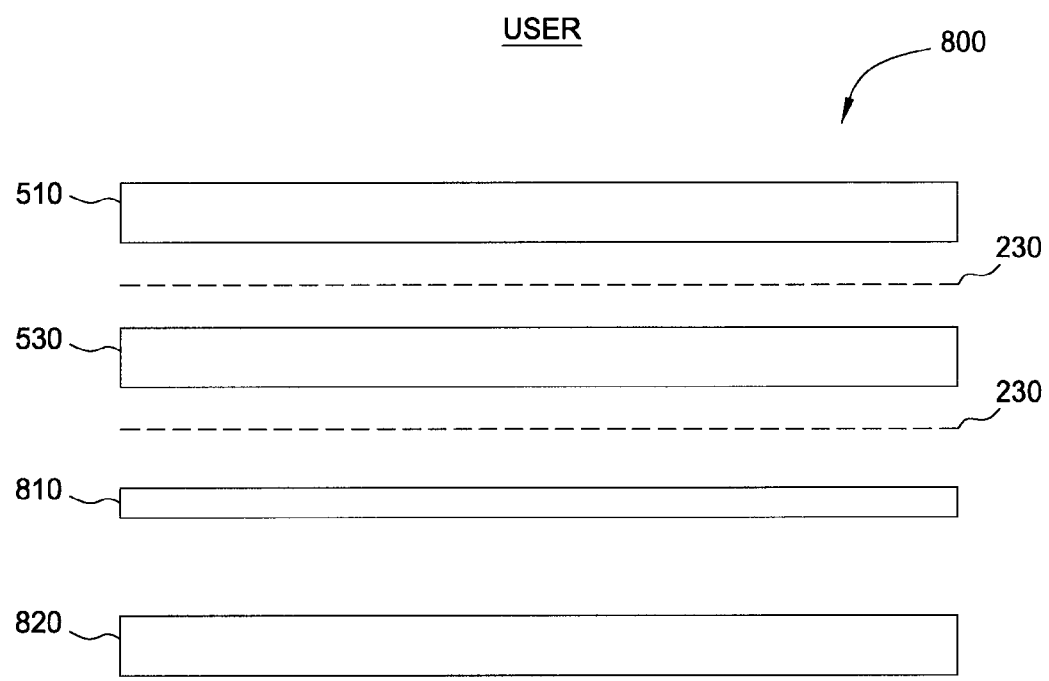
FIG. 9 is an exploded schematic view of an OLED display device illustrating locations at which one or more shield electrode(s) may be disposed.

FIG. 9 is an exploded schematic view of an OLED display device 800 illustrating alternative locations at which the shield electrode(s) 230 may be disposed. As discussed above with respect to FIG. 7, in each configuration illustrated in FIG. 9, the shield electrode(s) 230 may be disposed on or in one or both of the layers or substrates between which they are displayed. For example, the shield electrode(s) 230 may be disposed on the bottom surface of the lens 510 and/or on the top surface of the sealing layer 530. Optionally, the shield electrode(s) 230 may be disposed within any of the layers and/or substrates illustrated in FIG. 9 between the lens 510 and liquid crystal layer 540 in order to shield the receiver electrodes 220 from the conductive routing traces 215.

Figure 10:
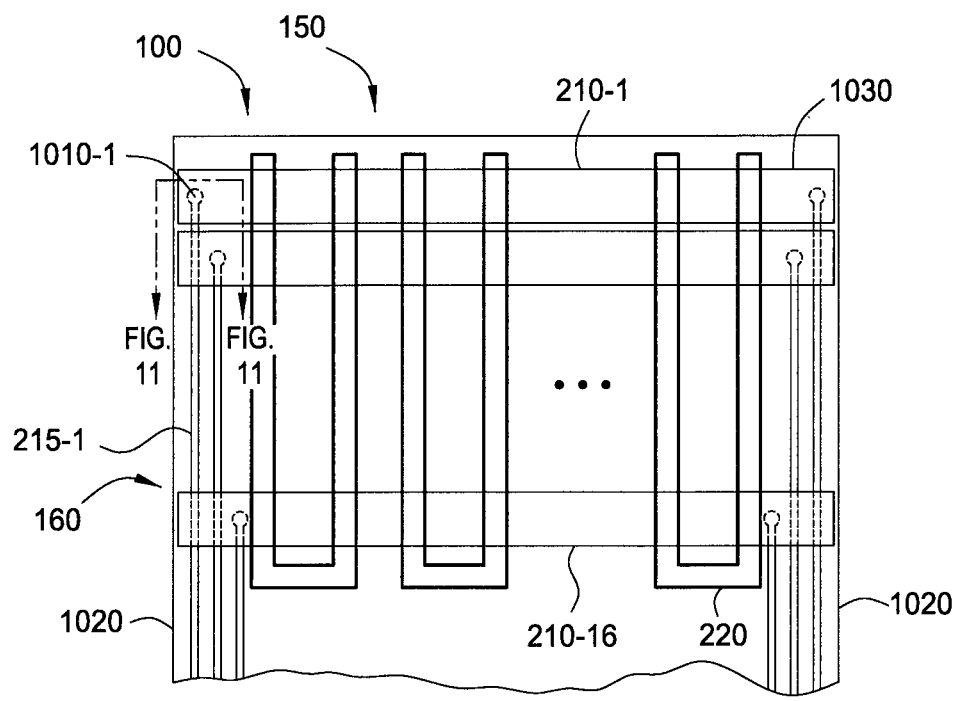
FIG. 10 is a schematic plan view in which receiver electrodes are shielded from conductive routing traces by end portions of common electrodes.

In other embodiments of the invention, the end portions of the common electrodes 210 may be configured as shield electrodes as to shield the receiver electrodes 220 from the conductive routing traces 215 to reduce the capacitive coupling between the receiver electrodes 220 and the conductive routing traces 215. For example, as shown in FIG. 10, the receiver electrodes 220 are shielded from the conductive routing traces 215 by end portions 1030 of the common electrodes 210 such that the end portions 1030 of the common electrodes 210 reduce the effect that an input object has on the capacitive coupling between the receiver electrodes 220 and the conductive routing traces 215. This "self-shielding" configuration enables the common electrodes 210 to be extended further towards the edges 1020 of the display device 160 and, consequently, enables display image pixels to be located closer to the edges of the display device 160, reducing the thickness of the border around the screen of the display device 160.

Figure 11A:
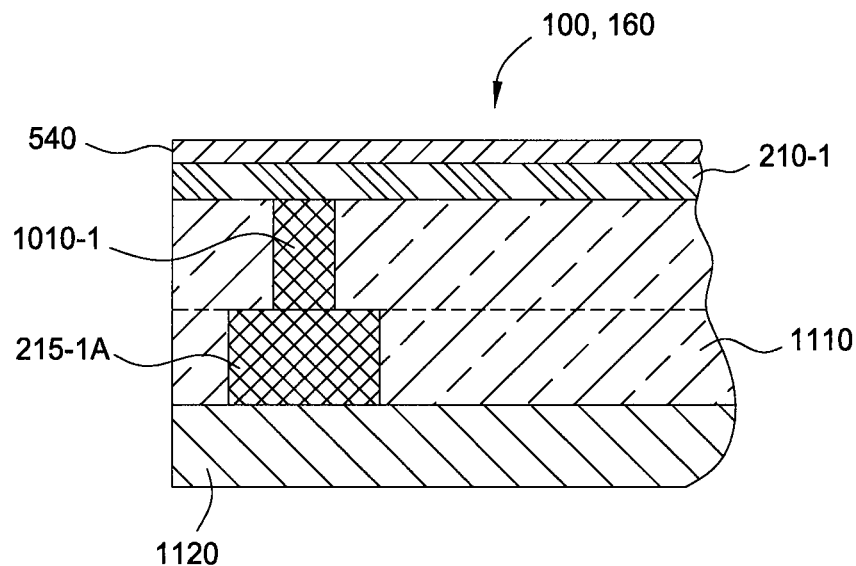
FIGS. 11A and 11B are schematic cross-sectional views of the input and display device of FIG. 10 in accordance with different embodiments of the invention.
Figure 11B:
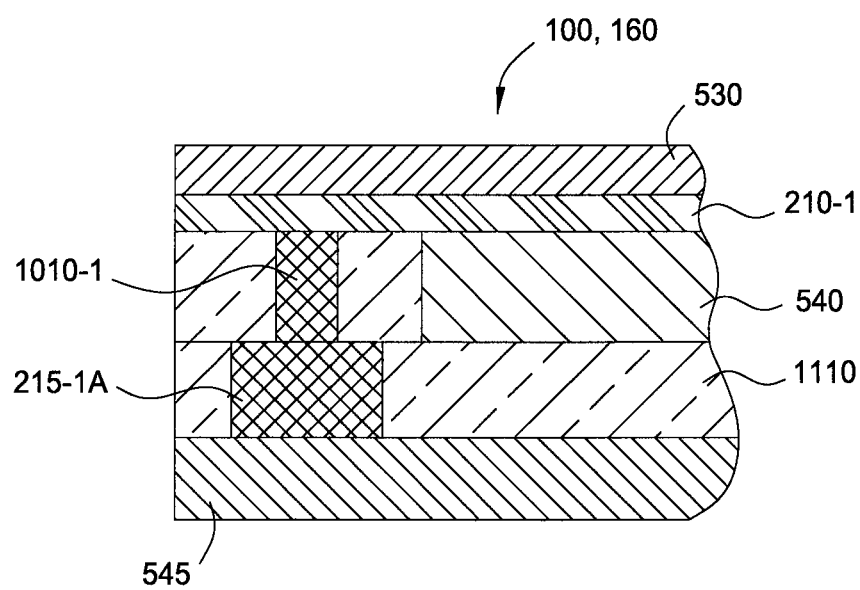

FIGS. 11A and 11B are schematic cross-sectional views of the input and display device 100, 160 of FIG. 10 in accordance with different embodiments of the invention. As shown in FIGS. 11A and 11B, the conductive routing traces 215 are routed below the end portions 1030 of the common electrodes 210 and are electrically isolated from the common electrodes 210 by an insulating layer 1110. Each conductive routing trace 215 is coupled to a bottom surface of a common electrode 210 by a through-connection 1010 disposed in a via formed in the insulating layer 1110. As both the through-connection 1010-1 and conductive routing traces 215-1 are below the common electrode 210, with the common electrode 210 blocking the line of sight path between the traces 215-1 and receiver electrodes 220, the common electrodes 210 effectively shield the conductive routing traces 215-1 from the receiver electrodes 220, thereby reducing the capacitive coupling between the conductive routing traces 215-1 and the receiver electrodes 220.

In FIG. 11A, the through-connection 1010-1 and the conductive routing trace 215-1 each are disposed in the insulating layer 1110. The substrate 1120 shown in FIG. 11A may be any substrate or layer (e.g., glass, plastic, or the like) of the display device 160, such as a liquid crystal layer, an OLED layer, etc. In FIG. 11B, the conductive routing trace 215-1a is disposed in an insulating layer 1110 that is positioned between the liquid crystal layer 540 and the TFT substrate layer 545 of the display device 160 (e.g., on a sealing ring of the display device). In this configuration, one of the conductive routing traces 215-1a is connected to the common electrode 210-1 by a through-connection 1010-1 disposed proximate the liquid crystal layer 540. As shown in FIG. 11B, the through-connection 1010-1 may be insulated from the liquid crystal layer 540 by an insulating or sealing ring disposed around the through-connection 1010-1.

Figure 12:
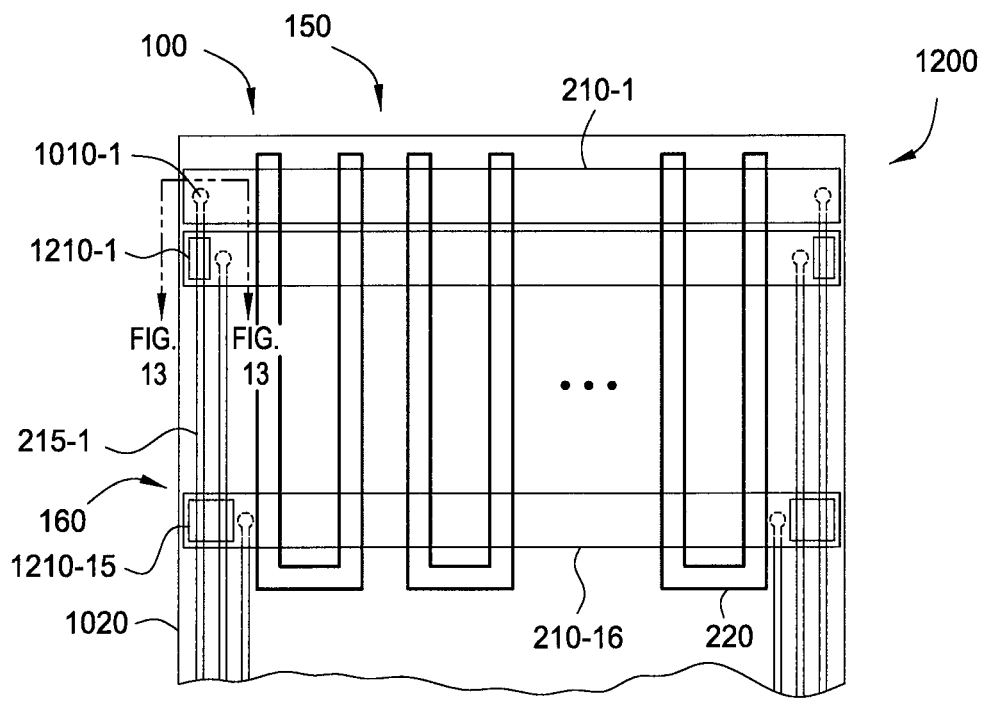
FIG. 12 is a schematic plan view of the input and display device of FIG. 10 in which apertures are formed in common electrodes to decrease coupling between conductive routing traces and common electrodes.

FIG. 12 is a schematic plan view of the input and display device 100, 160 of FIG. 10 in which apertures 1210 are formed in the common electrodes 210 to decrease coupling between the conductive routing traces 215 and the common electrodes 210 from which they are designed to be electrically isolated. For example, aperture 1210-1 is formed in common electrode 210-2 to decrease the capacitive coupling between common electrode 210-2 and one of the conductive routing traces 215-1. Although the capacitive coupling between the conductive routing traces 215-1 and the common electrode 210-2 is reduced, the end portion of the common electrode 210-2 continues to effectively shield the conductive routing trace 215-1 from the receiver electrodes 220.

Figure 13A:
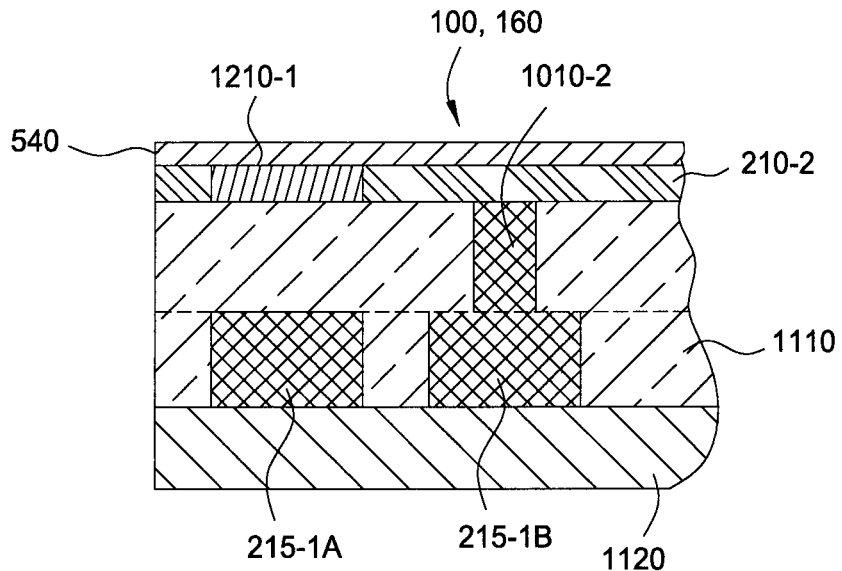
FIGS. 13A and 13B are schematic cross-sectional views of the input and display device of FIG. 12 in accordance with different embodiments of the invention.
Figure 13B:
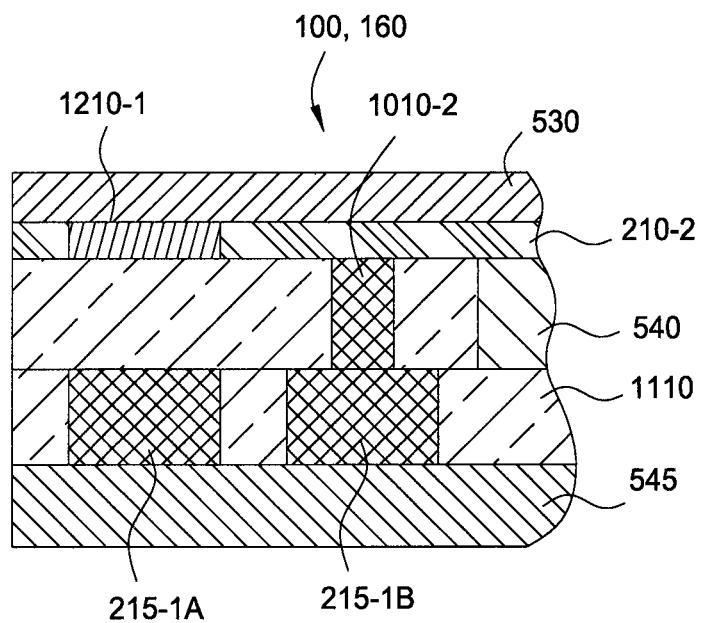

FIGS. 13A and 13B are schematic cross-sectional views of the input and display device 100, 160 of FIG. 12 in accordance with different embodiments of the invention. As shown in FIGS. 13A and 13B, the conductive routing traces 215-1, 215-1b are electrically isolated from the common electrodes 210 by an insulating layer 1110. Each conductive routing trace 215 is coupled to a bottom of a common electrode 210 by a through-connection 1010. The common electrode 210 blocks the line of sight path between the conductive routing traces 215 and the receiver electrodes 220, thereby shielding the conductive routing traces 215 from the receiver electrodes 220. In FIGS. 13A and 13B, an aperture 1210-1 is formed in common electrode 210-2 over the conductive routing trace 215-1a to reduce the capacitive coupling between the conductive routing trace 215-1a and the common electrode 210-2. Optionally, the aperture 1210-1 may be filled with an insulating material, as shown in FIGS. 13A and 13B.

In FIG. 13A, the conductive routing traces 215-1 and the through-connection 1010-2 each are disposed in the insulating layer 1110. The substrate 1120 may be any substrate or layer of the display device 160, such as a liquid crystal layer, an OLED layer, etc. In FIG. 13B, the conductive routing traces 215-1 are disposed in an insulating layer 1110 that is positioned between the liquid crystal layer 540 and the TFT substrate layer 545 of the display device 160. In this configuration, one of the conductive routing traces 215-1 is connected to the common electrode 210-2 by a through connection 1010-2 that is disposed in the liquid crystal layer 540. As shown in FIG. 13B, the through-connection 1010-2 may be insulated from the liquid crystal layer 540 by an insulating ring or sealing ring disposed around the through-connection 1010-2.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A touch screen device with an integrated capacitive sensing device comprising:
   a facesheet;
   a display device comprising a plurality of common electrodes configured for updating the display device and for capacitive sensing;
   a plurality of sensor electrodes, each of the plurality of sensor electrodes comprising at least one common electrode of the plurality of common electrodes;
   an insulating layer disposed on a side of the plurality of sensor electrodes facing away from the facesheet; and
   a plurality of conductive routing traces disposed on the insulating layer, wherein each of the plurality of conductive routing traces are coupled to a respective one of the plurality of sensor electrodes through a via, at least a first conductive routing trace of the plurality of conductive routing traces passing under at least two sensor electrodes of the plurality of sensor electrodes that are not coupled to the first conductive routing trace, and wherein the plurality of sensor electrodes are disposed between the facesheet and the plurality of conductive routing traces.

2. The touch screen device of claim 1, further comprising:
   a processing system integrated circuit (IC) and wherein the processing system (IC) is coupled to plurality of the sensor electrodes through the plurality of conductive routing traces.

3. A touch screen device with an integrated capacitive sensing device comprising:
   a facesheet;
   a display device comprising a plurality of common electrodes configured for updating the display device and for capacitive sensing;
   a plurality of sensor electrodes, each of the plurality of sensor electrodes comprising at least one common electrode of the plurality of common electrodes;
   an insulating layer disposed on a side of the plurality of sensor electrodes facing away from the facesheet; and
   a plurality of conductive routing traces disposed on the insulating layer, wherein each of the plurality of conductive routing traces are coupled to a respective one of the plurality of sensor electrodes through a via, wherein the plurality of sensor electrodes are disposed between the facesheet and the plurality of conductive routing traces, and wherein the plurality of conductive routing traces are routed in parallel below the sensor electrodes.

4. The touch screen device of claim 1 further comprising:
   an OLED layer, wherein the plurality of conductive routing traces are disposed between the OLED layer and the plurality of sensor electrodes.

5. The touch screen device of claim 1, wherein the first conductive routing trace of the plurality of conductive routing trace is coupled to a first sensor electrode of the plurality of sensor electrodes and is routed beneath a second sensor electrode of the plurality of sensor electrodes.

6. The touch screen device of claim 1, wherein the first conductive routing trace of the plurality of conductive routing trace and a second conductive routing trace of the plurality of conductive routing trace are coupled to a first sensor electrode of the plurality of sensor electrode.

7. The touch screen device of claim 1, wherein the facesheet is a lens for the display device.

8. An input device comprising:
   a facesheet;
   a display device comprising a plurality of common electrodes configured for updating the display device and for capacitive sensing;
   a plurality of sensor electrodes, each of the plurality of sensor electrodes comprising at least one common electrode of the plurality of common electrodes;
   an insulating layer disposed on a side of the plurality of sensor electrodes facing away from the facesheet;
   a plurality of conductive routing traces disposed on the insulating layer, wherein each of the plurality of conductive routing traces are coupled to one of the plurality of sensor electrodes through a via, at least a first conductive routing trace of the plurality of conductive routing traces passing under at least two sensor electrodes of the plurality of sensor electrodes that are not coupled to the first conductive routing trace, and wherein the plurality of sensor electrodes are disposed between the facesheet and the plurality of conductive routing traces; and
   a processing system configured to be coupled to the plurality of conductive routing traces and to drive plurality of sensor electrodes for capacitive sensing.

9. The input device of claim 8, wherein driving the plurality of sensor electrodes for capacitive sensing comprises:
   driving the plurality of sensor electrodes for absolute capacitive sensing.

10. The input device of claim 8, where driving the plurality of sensor electrodes for capacitive sensing comprises;
    driving a first one of the plurality of sensor electrodes with a transmitter signal for transcapacitive sensing.

11. The input device of claim 8, wherein the processing system comprises:
    a first integrated circuit and a second integrated circuit and wherein the first integrated circuit is configured to drive the sensor electrodes for capacitive sensing.

12. An input device comprising:
    a facesheet;
    a display device comprising a plurality of common electrodes configured for updating the display device and for capacitive sensing;
    a plurality of sensor electrodes, each of the plurality of sensor electrodes comprising at least one common electrode of the plurality of common electrodes;
    an insulating layer disposed on a side of the plurality of sensor electrodes facing away from the facesheet;
    a plurality of conductive routing traces disposed on the insulating layer, wherein each of the plurality of conductive routing traces are coupled to one of the plurality of sensor electrodes through a via, and wherein the plurality of sensor electrodes are disposed between the facesheet and the plurality of conductive routing traces; and
    a processing system configured to be coupled to the plurality of conductive routing traces and to drive plurality of sensor electrodes for capacitive sensing, and wherein the plurality of conductive routing traces are routed in parallel below the sensor electrodes.

13. The input device of claim 12 further comprising:
    an OLED layer, wherein the plurality of conductive routing traces are disposed between the OLED layer and the plurality of sensor electrodes.

14. The input device of claim 8, wherein the first conductive routing trace of the plurality of conductive routing trace is coupled to a first sensor electrode of the plurality of sensor electrodes and is routed beneath a second sensor electrode of the plurality of sensor electrodes.

15. The input device of claim 8, wherein the first conductive routing trace of the plurality of conductive routing trace and a second conductive routing trace of the plurality of conductive routing trace are coupled to a first sensor electrode of the plurality of sensor electrode.

16. The input device of claim 8 further comprising a plurality of receiver electrodes.

17. The input device of claim 16, wherein the receiver electrodes are disposed between the facesheet and the plurality of sensor electrodes.

18. A processing system for an input device comprising a display device with an integrated capacitive sensing device, the processing system comprising:

a driver module configured to couple to a plurality of sensor electrodes through a plurality of conductive routing traces disposed on an insulator layer, the insulting layer disposed below the sensor electrodes, wherein each sensor electrode comprises at least one common electrode of the display device, the common electrodes configured for updating a display of the display device and capacitive sensing, wherein each conductive routing trace is coupled to a one of the plurality of sensor electrodes through a via, wherein at least a first conductive routing trace of the plurality of conductive routing traces passing under at least two sensor electrodes of the plurality of sensor electrodes that are not coupled to the first conductive routing trace, and wherein the plurality of sensor electrodes are disposed between a facesheet of the touch screen device and the plurality of conductive routing traces, wherein the driver module is configured to drive plurality of sensor electrodes for capacitive sensing; and a determination module configured to determine positional information of an input object in a sensing region of the input device based on resulting signals received while driving the plurality of sensor electrodes for capacitive sensing.

19. The processing system of claim 18, wherein driving the plurality of sensor electrodes for capacitive sensing comprises:

driving the plurality of sensor electrodes for absolute capacitive sensing.

20. The processing system of claim 18, where driving the plurality of sensor electrodes for capacitive sensing comprises:

driving a first one of the plurality of sensor electrodes with a transmitter signal for transcapacitive sensing.

\* \* \* \* \*